United States Patent
Biloiu et al.

(10) Patent No.: US 11,596,051 B2
(45) Date of Patent: Feb. 28, 2023

(54) RESONATOR, LINEAR ACCELERATOR CONFIGURATION AND ION IMPLANTATION SYSTEM HAVING TOROIDAL RESONATOR

(71) Applicant: Applied Materials, Inc., Santa Clara, CA (US)

(72) Inventors: Costel Biloiu, Rockport, MA (US); Charles T. Carlson, Cedar Park, TX (US); Frank Sinclair, Boston, MA (US); Paul J. Murphy, Reading, MA (US); David T. Blahnik, Round Rock, TX (US)

(73) Assignee: Applied Materials, Inc., Santa Clara, CA (US)

( * ) Notice: Subject to any disclaimer, the term of this patent is extended or adjusted under 35 U.S.C. 154(b) by 182 days.

(21) Appl. No.: 17/108,747

(22) Filed: Dec. 1, 2020

(65) Prior Publication Data
US 2022/0174810 A1    Jun. 2, 2022

(51) Int. Cl.
*H05H 7/22*    (2006.01)
*H01J 37/317*    (2006.01)

(52) U.S. Cl.
CPC ........... *H05H 7/22* (2013.01); *H01J 37/3171* (2013.01); *H05H 2007/222* (2013.01)

(58) Field of Classification Search
None
See application file for complete search history.

(56) References Cited

U.S. PATENT DOCUMENTS

| | | | |
|---|---|---|---|
| 5,386,177 A * | 1/1995 | Uhm | H01J 25/14 330/41 |
| 5,504,341 A | 4/1996 | Glavish | |
| 5,581,154 A * | 12/1996 | Uhm | H01J 25/11 315/5.39 |
| 5,714,913 A * | 2/1998 | Carlsten | H01J 25/06 331/81 |
| 5,744,919 A * | 4/1998 | Mishin | H05H 9/00 315/505 |

(Continued)

FOREIGN PATENT DOCUMENTS

| | | |
|---|---|---|
| CN | 1922707 A | 2/2007 |
| CN | 104465296 A | 3/2015 |

(Continued)

OTHER PUBLICATIONS

International Search Report and Written Opinion dated Feb. 23, 2022, for the International Patent Application No. PCT/US2021/057412 filed on Oct. 29, 2021, 7 pages.

*Primary Examiner* — Srinivas Sathiraju
(74) *Attorney, Agent, or Firm* — KDB Firm PLLC (57) ABSTRACT

An apparatus may include a drift tube assembly, arranged to transmit an ion beam. The drift tube assembly may include a first ground electrode; an RF drift tube assembly, disposed downstream of the first ground electrode; and a second ground electrode, disposed downstream of the RF drift tube assembly. The RF drift tube assembly may define a triple gap configuration. The apparatus may include a resonator, where the resonator comprises a toroidal coil, having a first end, connected to a first RF drift tube of the RF drift tube assembly, and a second end, connected to a second RF drift tube of the RF drift tube assembly.

18 Claims, 12 Drawing Sheets

(56) References Cited

U.S. PATENT DOCUMENTS

| | | | | |
|---|---|---|---|---|
| 5,796,219 | A * | 8/1998 | Hirakimoto | H05H 7/12 315/506 |
| 5,801,488 | A * | 9/1998 | Fujisawa | H05H 9/00 315/505 |
| 6,242,747 | B1 * | 6/2001 | Sugitani | H05H 9/00 250/251 |
| 6,262,638 | B1 * | 7/2001 | Scherer | H05H 7/02 315/505 |
| 6,291,828 | B1 * | 9/2001 | Saadatmand | H01J 37/3171 250/492.21 |
| 6,320,334 | B1 * | 11/2001 | Roberge | H01J 37/304 315/505 |
| 6,326,746 | B1 * | 12/2001 | Chen | H05H 9/00 315/505 |
| 6,423,976 | B1 * | 7/2002 | Glavish | H01J 37/3171 315/505 |
| 6,777,893 | B1 * | 8/2004 | Swenson | H05H 9/00 315/505 |
| 6,949,895 | B2 * | 9/2005 | DiVergilio | H01J 37/12 315/505 |
| 7,098,615 | B2 * | 8/2006 | Swenson | H05H 9/00 315/505 |
| 7,767,561 | B2 * | 8/2010 | Hanawa | H01J 37/32357 257/E21.057 |
| 8,324,810 | B2 * | 12/2012 | Kazakov | H05H 7/06 315/505 |
| 9,269,541 | B2 * | 2/2016 | Inada | H01J 37/3171 |
| 10,505,334 | B2 * | 12/2019 | Yang | H01J 23/06 |
| 10,651,011 | B2 * | 5/2020 | Sinclair | H01J 37/20 |
| 10,991,546 | B1 * | 4/2021 | Kowal | H01J 37/3171 |
| 11,089,670 | B2 * | 8/2021 | Mishin | H05H 9/04 |
| 11,160,158 | B1 * | 10/2021 | Nguyen | H05H 9/048 |
| 11,189,460 | B1 * | 11/2021 | Carlson | H01J 37/3007 |
| 11,217,427 | B1 * | 1/2022 | Renau | H01J 37/1472 |
| 11,388,810 | B2 * | 7/2022 | Kurunczi | H05H 7/22 |
| 2002/0084427 | A1 * | 7/2002 | Saadatmand | H05H 9/00 250/492.1 |
| 2004/0256578 | A1 | 12/2004 | Mitchell et al. | |
| 2007/0164237 | A1 * | 7/2007 | Bernhardt | H01J 37/248 250/492.21 |
| 2009/0314949 | A1 * | 12/2009 | Plettner | H05H 7/06 250/397 |
| 2010/0072401 | A1 * | 3/2010 | Parrill | H01L 21/26506 250/492.21 |
| 2010/0072405 | A1 * | 3/2010 | Yu | H01J 25/02 250/493.1 |
| 2014/0034825 | A1 * | 2/2014 | Newton | H01J 49/40 250/282 |
| 2014/0345522 | A1 * | 11/2014 | Kabasawa | H01L 21/26506 118/688 |
| 2016/0174355 | A1 * | 6/2016 | Lal | H05H 9/045 315/505 |
| 2016/0293154 | A1 * | 10/2016 | Yang | G10K 11/172 |
| 2018/0120504 | A1 * | 5/2018 | Qi | G02B 6/3636 |
| 2018/0276164 | A1 * | 9/2018 | Das Sharma | G06F 13/4022 |
| 2019/0371562 | A1 * | 12/2019 | Sinclair | H01J 37/05 |
| 2020/0066486 | A1 * | 2/2020 | Sinclair | H01J 37/3007 |
| 2020/0357603 | A1 * | 11/2020 | Sinclair | H01J 37/20 |
| 2021/0074508 | A1 * | 3/2021 | Lee | H01J 37/244 |
| 2021/0307152 | A1 * | 9/2021 | Kowal | H01J 37/08 |
| 2021/0321876 | A1 * | 10/2021 | Zare Bidaki | A61B 3/14 |
| 2022/0037116 | A1 * | 2/2022 | Sinclair | H01J 37/32082 |
| 2022/0174810 | A1 * | 6/2022 | Biloiu | H05H 7/22 |
| 2022/0183137 | A1 * | 6/2022 | Sinclair | H05H 7/22 |

FOREIGN PATENT DOCUMENTS

| | | |
|---|---|---|
| CN | 108538691 A | 9/2018 |
| CN | 110085499 A | 8/2019 |
| JP | 4131512 B2 | 8/2008 |
| JP | 2020534639 | 11/2020 |
| TW | 200952025 A | 12/2009 |
| WO | 2003032694 | 4/2003 |

* cited by examiner

RESONATOR, LINEAR ACCELERATOR CONFIGURATION AND ION IMPLANTATION SYSTEM HAVING TOROIDAL RESONATOR

FIELD OF THE DISCLOSURE

The disclosure relates generally to ion implantation apparatus and more particularly to high energy beamline ion implanters.

BACKGROUND OF THE DISCLOSURE

Ion implantation is a process of introducing dopants or impurities into a substrate via ion bombardment. Ion implantation systems may comprise an ion source and a series of beam-line components. The ion source may comprise a chamber where ions are generated. The ion source may also comprise a power source and an extraction electrode assembly disposed adjacent the chamber. The beam-line components, may include, for example, a mass analyzer, a first acceleration or deceleration stage, a collimator, and a second acceleration or deceleration stage. Much like a series of optical lenses for manipulating a light beam, the beam-line components can filter, focus, and manipulate ions or ion beam having particular species, shape, energy, and/or other qualities. The ion beam passes through the beam-line components and may be directed toward a substrate mounted on a platen or clamp.

Implantation apparatus capable of generating ion energies of approximately 1 MeV or greater are often referred to as high energy ion implanters, or high energy ion implantation systems. One type of high energy ion implanter is termed linear accelerator, or LINAC, where a series of electrodes arranged as tubes conduct and accelerate the ion beam to increasingly higher energy along the succession of tubes, where the electrodes receive an AC voltage signal. Known (RF) LINACs are driven by an RF voltage applied at frequencies between 13.56 MHz-120 MHz.

In known LINACs (for the purposes of brevity, the term LINAC as used herein may refer to an RF LINAC using RF signals to accelerate an ion beam) in order to reach a targeted final energy, such as one MeV, several MeV, or greater, the ion beam may be accelerated in multiple acceleration stages. Each successive stage of the LINAC may receive the ion beam at increasingly higher energy, and accelerate the ion beam to still higher energy.

Depending on the number of drift tubes (acceleration electrodes) known acceleration stages may employ a so-called double gap configuration or a so-called triple gap configuration. An advantage of the triple gap configuration is that three acceleration gaps are provided within a given acceleration stage, allowing accelerated ions to increase energy by a maximum increase equal to 4 times the ion charge state times maximum rf voltage amplitude generated on the electrodes. For comparison, for the same ionic species a two-gap configuration may accelerate the ion beam to a maximum of 2 times the ion charge state times maximum rf voltage amplitude on the accelerating drift tubes. Thus, for a given maximum available drive voltage, a triple gap configuration may accelerate an ion beam to a target ion energy using fewer acceleration stages than a double gap configuration.

While the use of triple gap configuration within a given acceleration stage may present a more efficient configuration than double gap configurations, the size of LINACs is still relatively long, due in part to large resonator components needed to generate the high rf voltage on the drift tubes (acceleration electrodes).

With respect to these and other considerations the present disclosure is provided.

BRIEF SUMMARY

In one embodiment an apparatus is provided, including a drift tube assembly, arranged to transmit an ion beam. The drift tube assembly may include a first ground electrode; an RF drift tube assembly, disposed downstream of the first ground electrode; and a second ground electrode, disposed downstream of the RF drift tube assembly. As such, the RF drift tube assembly may define a triple gap configuration. The apparatus may also include a resonator, including a toroidal coil, the toroidal coil having a first end, connected to a first RF drift tube of the RF drift tube assembly, and a second end, connected to a second RF drift tube of the RF drift tube assembly.

In another embodiment, an ion implanter is provided, including an ion source to generate an ion beam, and a linear accelerator, to transport and accelerate the ion beam, where the linear accelerator includes a plurality of acceleration stages. A given acceleration stage of the plurality of acceleration stages may include an RF power assembly, arranged to output an RF signal, and a drift tube assembly, arranged to transmit the ion beam, and coupled to the RF power assembly, where the drift tube assembly defines a triple gap configuration. The given acceleration stage may further include a resonator, including a toroidal coil, the toroidal coil having a first end, connected to a first RF drift tube of the drift tube assembly, and a second end, connected to a second RF drift tube of the drift tube assembly.

In another embodiment, a resonator for a linear accelerator is provided. The resonator may include an RF enclosure and a toroidal coil, disposed within the RF enclosure. The toroidal coil may include a first half, forming a first coil, having a first plurality of turns, wound in a first direction; and a second half, forming a second coil, having a second plurality of turns, wound in the first direction. As such, the first half may further include a first end for coupling to a first electrode of the linear accelerator, and the second half may further include a second end for coupling to a second electrode of the linear accelerator. The resonator may also include an exciter coil, disposed inside the toroidal coil, the exciter coil having a first leg connected to ground and a second leg coupled to receive RF power.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

DETAILED DESCRIPTION

An apparatus, system and method in accordance with the present disclosure will now be described more fully hereinafter with reference to the accompanying drawings, where embodiments of the system and method are shown. The system and method may be embodied in many different forms and are not be construed as being limited to the embodiments set forth herein. Instead, these embodiments are provided so this disclosure will be thorough and complete, and will fully convey the scope of the system and method to those skilled in the art.

Terms such as "top," "bottom," "upper," "lower," "vertical," "horizontal," "lateral," and "longitudinal" may be used herein to describe the relative placement and orientation of these components and their constituent parts, with respect to the geometry and orientation of a component of a semiconductor manufacturing device as appearing in the figures. The terminology may include the words specifically mentioned, derivatives thereof, and words of similar import.

As used herein, an element or operation recited in the singular and proceeded with the word "a" or "an" are understood as potentially including plural elements or operations as well. Furthermore, references to "one embodiment" of the present disclosure are not intended to be interpreted as precluding the existence of additional embodiments also incorporating the recited features.

Provided herein are approaches for improved high energy ion implantation systems and components, based upon a beamline architecture, and in particular, ion implanters based upon linear accelerators. For brevity, an ion implantation system may also be referred to herein as an "ion implanter." Various embodiments entail novel approaches that provide the capability of flexibly adjusting the effective drift length within acceleration stages of a linear accelerator.

Figure 1:
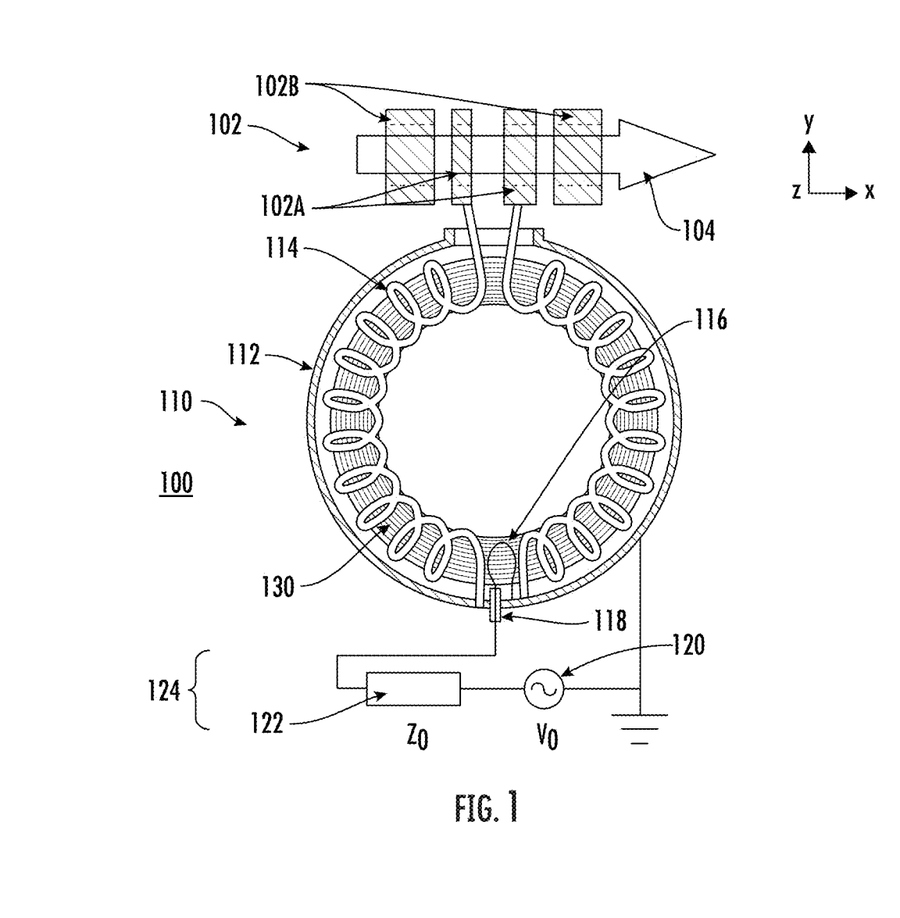
FIG. 1 shows an exemplary apparatus, according to embodiments of the disclosure.
Figure 10:
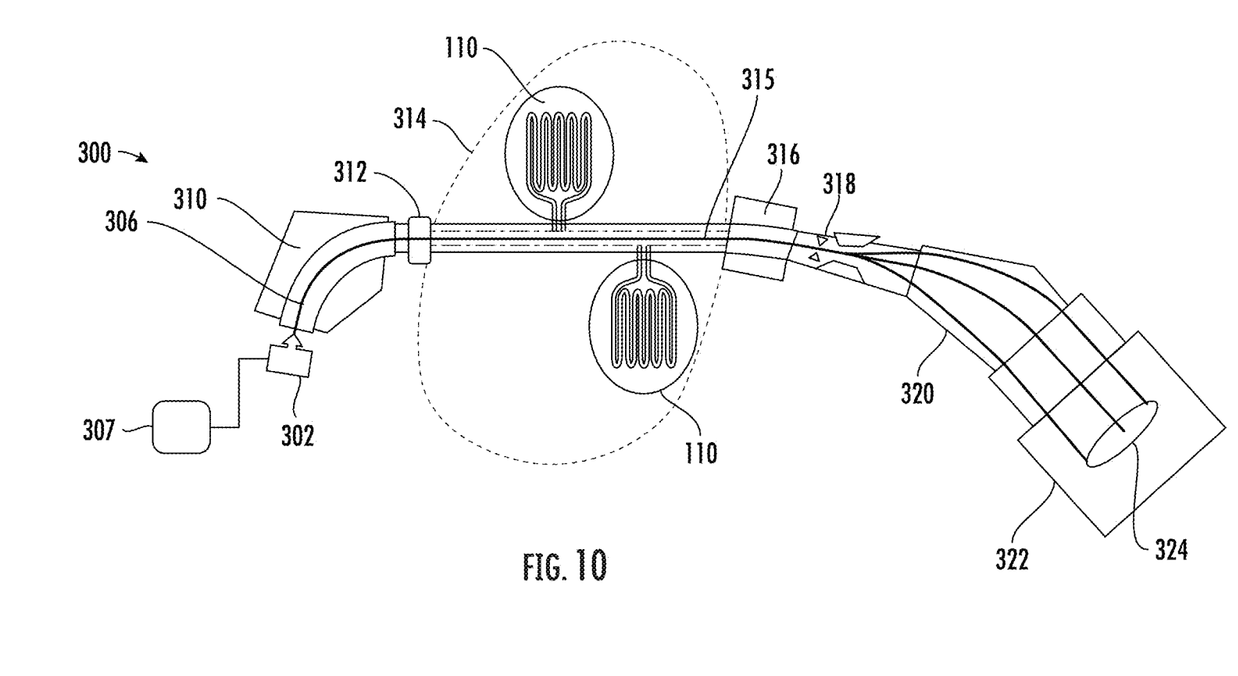
FIG. 10 depicts a schematic of an ion implanter apparatus, according to embodiments of the disclosure.

FIG. 1 shows an exemplary apparatus, in a first configuration, according to embodiments of the disclosure. The apparatus 100 represents an acceleration stage, including a drift tube assembly 102 and associated resonator 110, for accelerating an ion beam 104 in a linear accelerator. As shown in FIG. 10, discussed below, the apparatus 100 may be implemented in a plurality of acceleration stages of a linear accelerator 314 for accelerating an ion beam 306 in an ion implanter 300.

In the embodiment of FIG. 1, the drift tube assembly 102 includes an upstream grounded drift tube, and a downstream grounded drift tube, labeled similarly as grounded drift tube electrodes 102B. The drift tube assembly 102 further includes a pair of RF drift tube electrodes, shown as RF drift tube electrodes 102A, separated by a gap therebetween. Collectively, the RF drift tube electrodes 102A and grounded drift tube electrodes 102B define a triple gap configuration.

Figure 2:
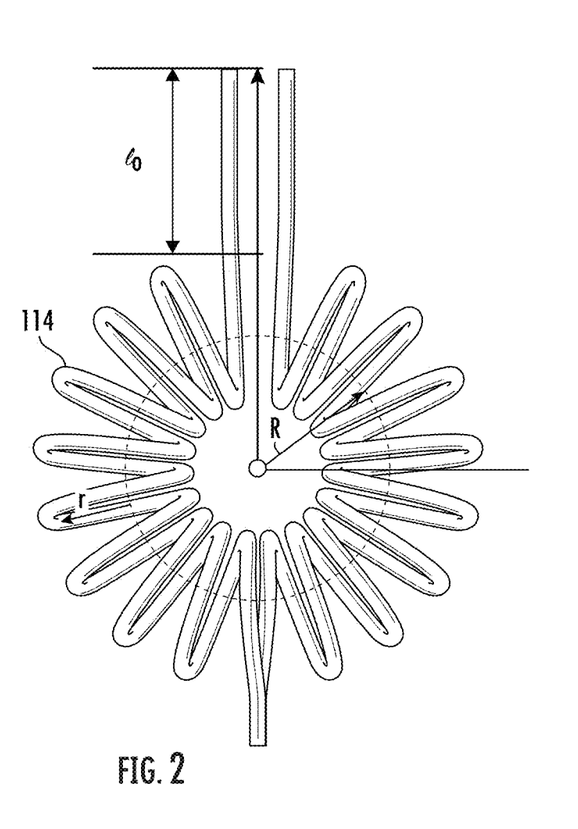
FIG. 2 presents a detailed front view of an embodiment of a toroidal coil.

The resonator 110 includes an rf enclosure (can) 112 to house a toroidal coil 114 and through the generated coil-enclosure electrostatic capacitance to form an electric oscillating circuit. The toroidal coil 114 and similar resonator coils are described in detail in the embodiments to follow. In brief, FIG. 2 presents a detailed front view of an embodiment of the toroidal coil 114. As used herein, the term "toroidal coil" may refer to two separate coils that are mutually arranged to define a toroid shape, where each of the separate coils may form a part of the toroid shape, such as similar halves of the toroid.

As shown in FIG. 2, the toroidal coil 114 includes a plurality of loops or turns. The toroidal coil 114 includes two coils arranged as two halves, having N turns each, and constructed of a suitable conductor, such as copper tubing. As shown in FIG. 2, the turns of each half of the toroidal coil 114 are wound in the same direction. At the upper part of the toroidal coil 114, the two ends of the toroidal coil 114 are extended by a length $l_0$ and passed through an opening in the rf enclosure (can) to allow further integration in an enclosure and for separate connection to two separate powered RF drift tube electrodes, described above. At the bottom part the loops of the toroidal coil 114 are connected to the grounded can wall.

The toroidal coil 114 is powered by an exciter coil 116, symmetrically located between the grounded legs of the toroidal coil 114. An insulating sleeve 118 ensures electrical insulation between the powered leg of the exciter coil and the grounded can wall. The exciter coil 116 is arranged to receive RF power as part of an RF power assembly, shown as the rf circuitry 124, including an RF generator 120 and impedance element 122. The resonator 110 further includes a tuner 130, which tuner may be arranged as a capacitive structure, as detailed below.

The apparatus 100 differs from known triple gap accelerator stages in that the resonator 110 delivers voltage to the drift tube assembly 102 via a toroidal coil 114, as opposed to solenoidal (or helical) coils of known triple gap accelerator stages. As discussed in more detail with respect to FIGS. 5A-5D, the toroidal coil resonator structure of FIG. 1 benefits from the fact that magnetic flux is contained inside the toroidal coil 114, avoiding leakage of field lines outside the toroidal coil 114, and thus leading to less induced eddy currents in the rf enclosure 112 of the resonator.

Figure 3A:
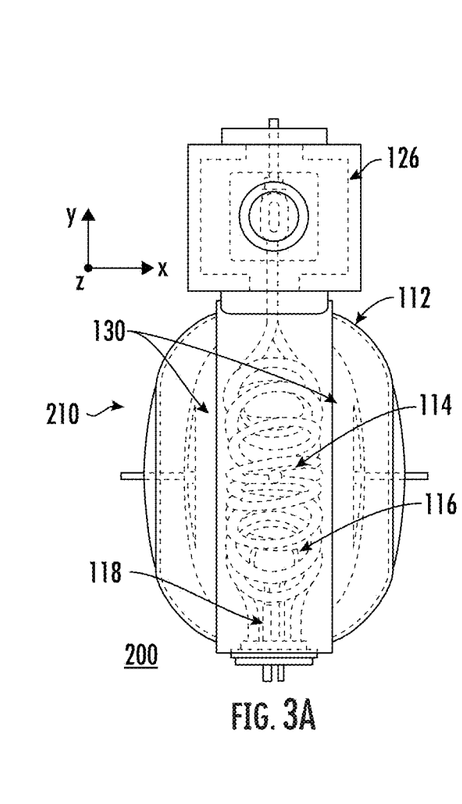
FIG. 3A, FIG. 3B, and FIG. 3C show a side view, perspective view, and front view, respectively, for an acceleration stage, according to embodiments of the disclosure.
Figure 3B:
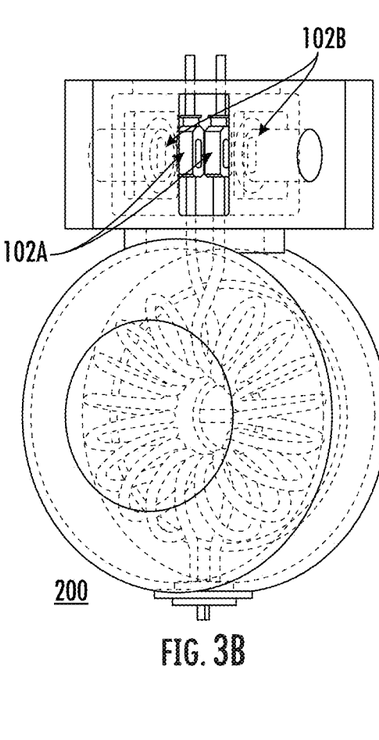
Figure 3C:
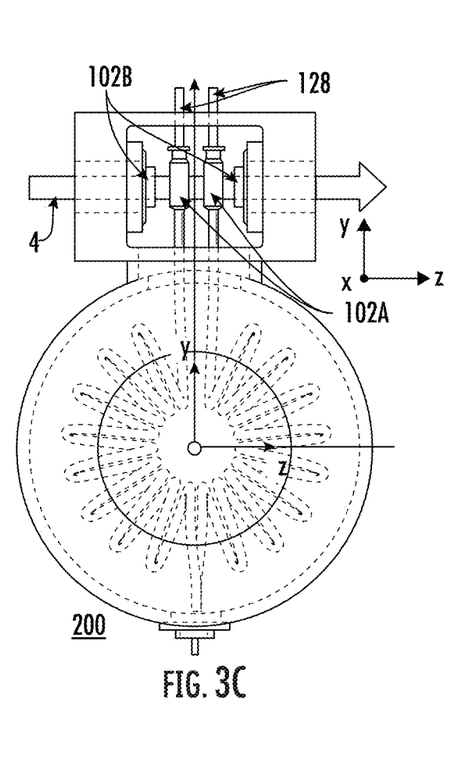

FIG. 3A, FIG. 3B, and FIG. 3C show a side view, perspective view, and front view, respectively, for an acceleration stage 200, according to embodiments of the disclosure. The acceleration stage includes a drift tube electrode assembly arranged as a triple gap configuration, within an ion beam housing 126, as well as insulating holders 128. The acceleration stage 200 further includes a resonator 210, including the toroidal coil 114, described above. The resonator 210 further includes a tuner 130, where the tuner 130 comprises a tuner body, disposed in a first part and a second part, along a first side of the toroidal coil 114 and a second side of the toroidal coil 114, respectively. Details of an embodiment of the tuner 130 are shown in FIG. 4C, discussed in detail below. In brief, the tuner 130 may be movable along a principle axis of the toroidal coil 114, shown as the x-axis in the Cartesian coordinate system shown. The movement of the tuner 130 along the X-axis may change the capacitance of an electrical RLC circuit defined by the resonator 210, so that a resonance frequency of the resonator 210 may be adjusted.

Figure 4A:
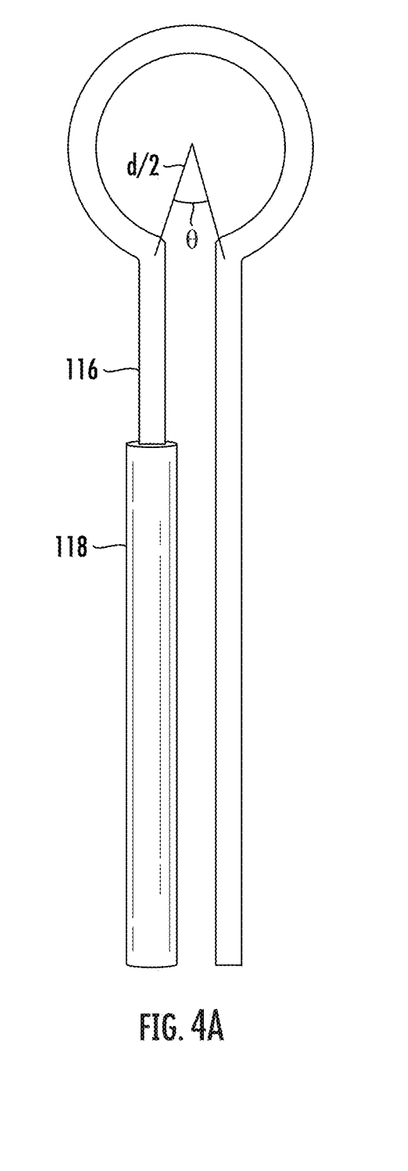
FIG. 4A illustrates an exciter coil according to embodiments of the disclosure.
Figure 4B:
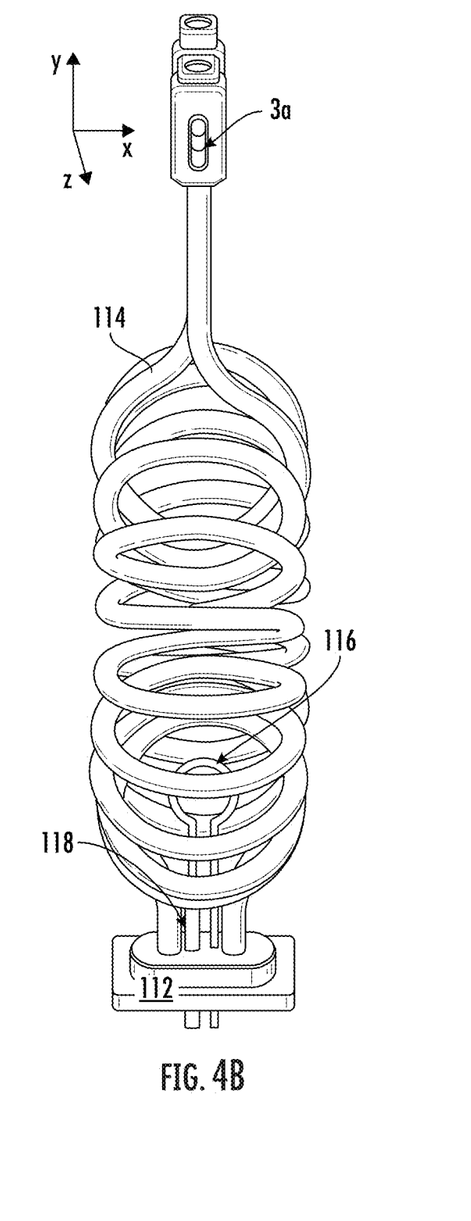
FIG. 4B illustrates the exciter coil of FIG. 4A within an exemplary toroidal coil.
Figure 4C:
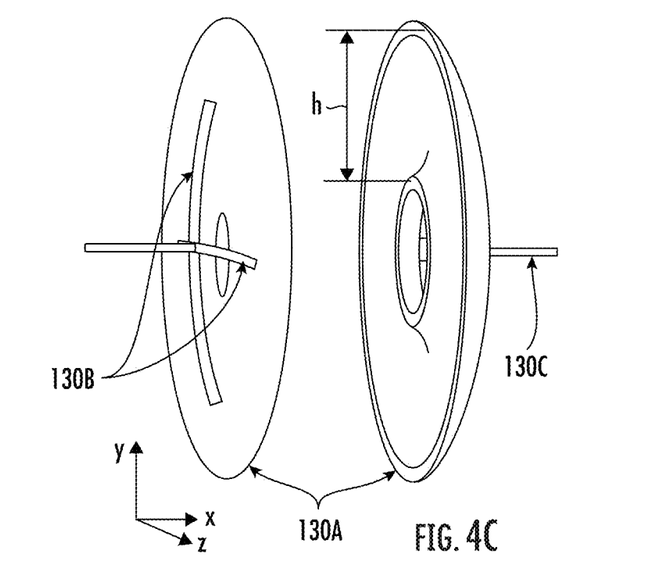
FIG. 4C shows an embodiment of a tuner for a resonator, according to embodiments of the disclosure.

FIG. 4A illustrates an exciter coil 116, while FIG. 4B shows the exciter coil 116, disposed within the toroidal coil 114, according to embodiments of the disclosure. The exciter coil 116 may have a first leg connected to ground (right leg) and a second leg (left leg) coupled to an rf power assembly. As shown in FIG. 4A, the leg of the exciter coil 116 coupled to an rf power assembly may be insulated with an insulating sleeve 118 from the rf enclosure 112.

In various embodiments, the exciter coil 116 is a one turn loop made of metal tubing such as copper tubing for fluid cooling. The loop diameter d may be arranged to be roughly equal to the minor radius of the toroidal coil 114. The angular opening angle θ may be between 15 and 20 deg, and is set according to the necessary spatial separation to prevent arcing to the grounded leg of the toroidal coil 114. To maximize the mutual coupling coefficient M between the exciter coil and toroidal coil, the exciter coil plane (in this case the X-Y plane) may be arranged perpendicular to the azimuthal axis of the toroid defined by the toroidal coil 114, having a center on this axis, and may be placed at the mid distance between the last grounded side loops of the toroid halves, as also shown in FIG. 3A and FIG. 3B.

Turning now to FIG. 4C, there is shown an embodiment of the tuner 130, including a first and second halves, shown as crowns 130A, arranged to be on opposite sides of the toroidal coil 114. In this embodiment, the crowns 130A are arranged as toroidal crowns that mimic the shape of the toroidal coil 114. A cross-shaped holder 130B is affixed to each of the halves, while also affixed to rods 130C. The rods 130C may be mounted on a guiding stage (not shown) and passed through the rf enclosure 112. The rods 130C may be driven from outside the rf enclosure 112 by a mechanism, such as a motorized linear motion stage, which stage can translate the rods 130C along the x axis. In one embodiment, to maximize the tuning range, the curvature radius of the crowns 130A may be set equal to the minor radius of the torus that forms the toroidal coil 114; in an embodiment, the height h of the crown 130A may be slightly larger than 2r, the minor diameter of the toroid. The tuner 130 may be set at ground potential so that the toroidal coil—toroidal crowns assembly forms a system or electrical circuit formed of two capacitors connected in parallel. As the coil-to-crown distance is increased, the capacitance decreases, leading to an increase in the resonant frequency.

In various non-limiting embodiments, the characteristics of a toroidal resonator are designed for a working resonant frequency to match a suitable RF power supply or rf generator operating frequency, such as 13.56 MHz. Because the cavity containing a toroidal coil forms an RLC circuit, the circuit will oscillate with a certain frequency $f_0$ having a value at resonance given by $$f_0 = 1/(2\pi\sqrt{LC}), \tag{1}$$

where L is the inductance of the coil and C the capacitance of the system.

Figure 4D:
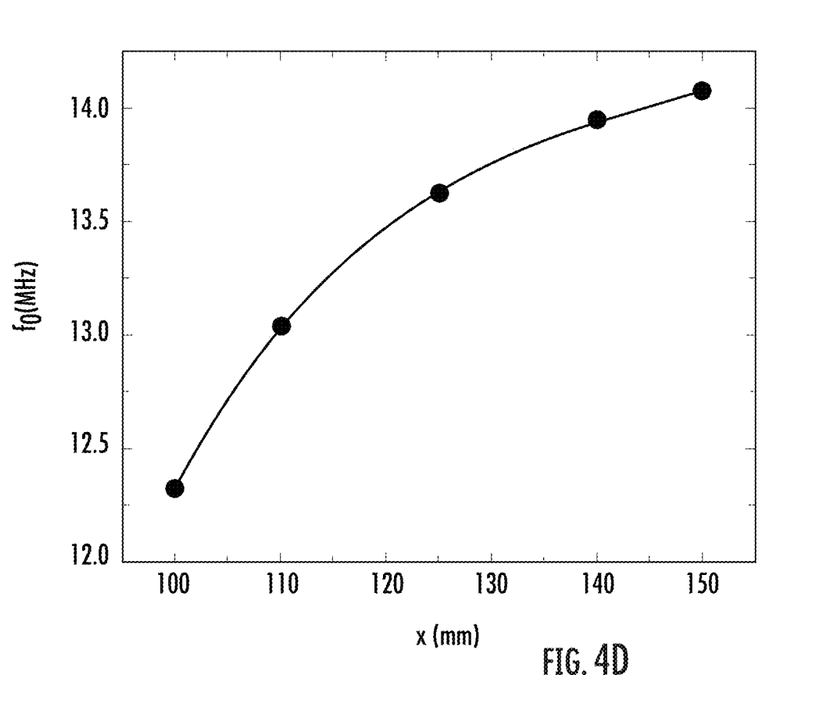
FIG. 4D shows the dependency of resonant frequency for a tuner structure of FIG. 4C.

Turning to FIG. 4D, there is shown the dependency of resonant frequency for the tuner structure of FIG. 4C, shown as a function of changing position of the crowns 130A. As shown in FIG. 4D, for a translation of 50 mm, from x=100 mm to x=150 mm from the azimuthal plane (Oyz) the tuner 130 generates a tuning range of more than 1.5 MHz around the desired frequency of 13.56 MHz.

Figure 5A:
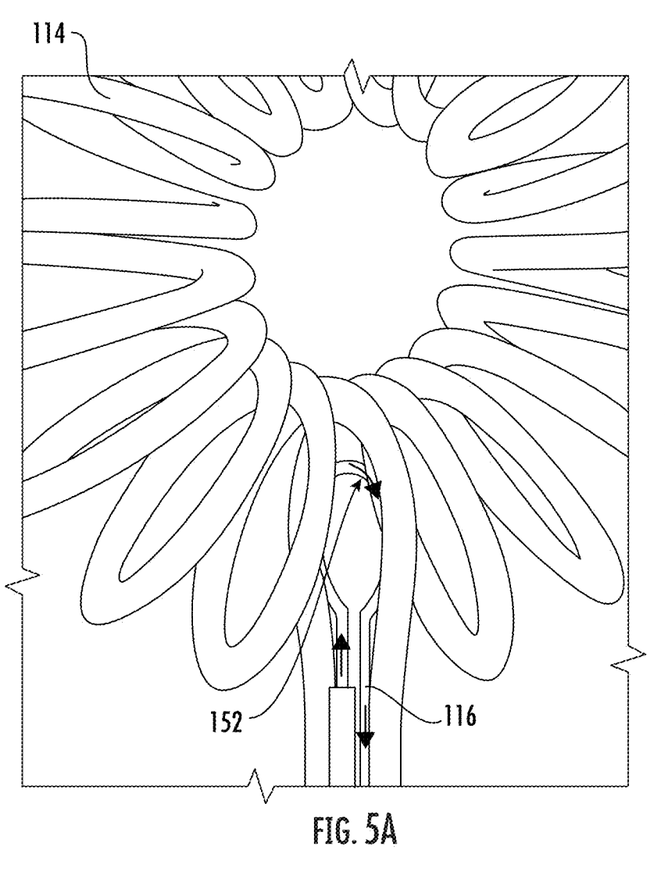
FIGS. 5A-5D show the electrical characteristics of a toroidal resonator coil employed as a resonator in a triple gap configuration, according to embodiments of the disclosure.
Figure 5B:
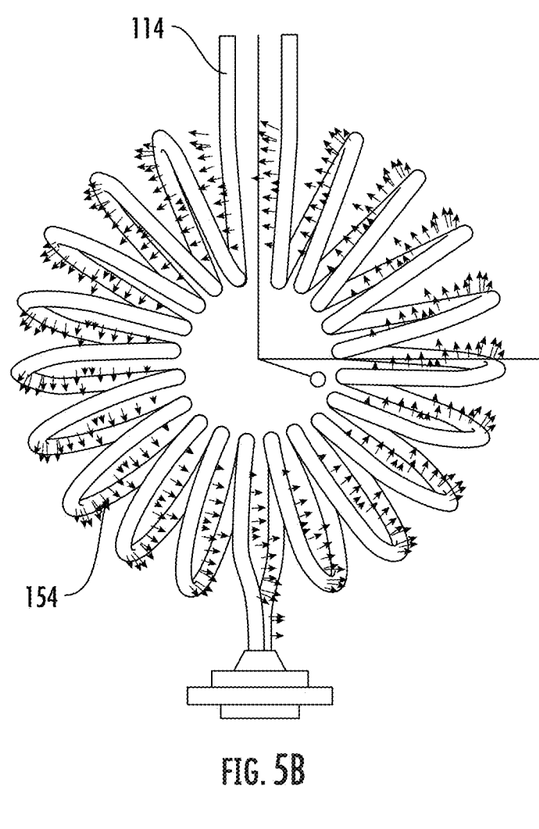
Figure 5C:
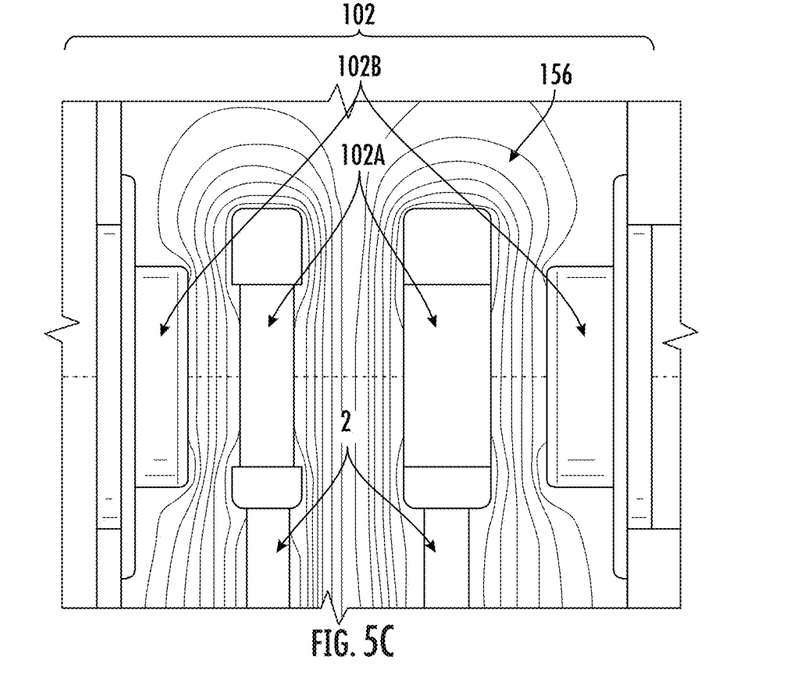
Figure 5D:
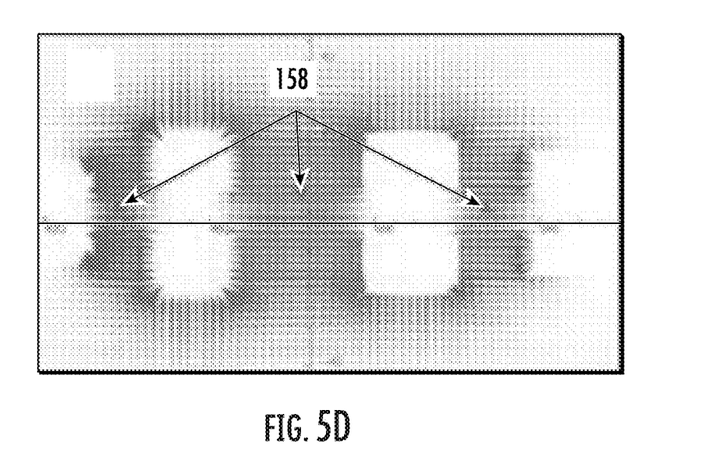

Turning to FIGS. 5A-5D there are shown the electrical characteristics of a toroidal resonator coil employed as a resonator in a triple gap configuration, according to embodiments of the disclosure. In FIG. 5A, there is shown the rf current traveling through an exciter coil 116 (current shown in dark arrows) at a given instant during rf cycle. The rf power applied at the input of the exciter coil 116 will generate an rf current 152, current will further generate a local time varying magnetic field. As shown in FIG. 5B, the mutual coupling between the exciter coil 116 and the toroidal coil 114 allows magnetic flux lines 154 to close through the volume of the toroidal coil 114. Because the rf power is transferred from the rf generator, through the exciter coil, to an electrically oscillating circuit, the magnetic energy in the toroidal coil 114, $$W_{mag} = \frac{B^2}{2\mu_0} \tag{2}$$

where B is magnetic field strength in the coil and $\mu_0$ is the magnetic permeability of the vacuum, will transform periodically into electrostatic energy $$W_{elec} = \frac{\varepsilon_0 E^2}{2} \tag{3}$$

where $\varepsilon_0$ is dielectric permittivity of vacuum and E is the electrostatic field at the toroidal coil 114 terminations, at the top of the figure. The voltage generated at the RF drift tube electrodes 102A generates electrostatic equipotential lines 156 in the three gaps between RF drift tube electrodes 102A and grounded drift tube electrodes 102B, where the electric field vectors 158 are shown in FIG. 5D. As known, the electric field thus formed will oscillate according to the frequency of the applied RF signal. By applying the correct timing of ions arrival in a pulsed or bunched ion beam at the entrance of the accelerating gaps the ions may gain an energy equal to up to 4 times the product charge times rf voltage amplitude.

Figure 5E:
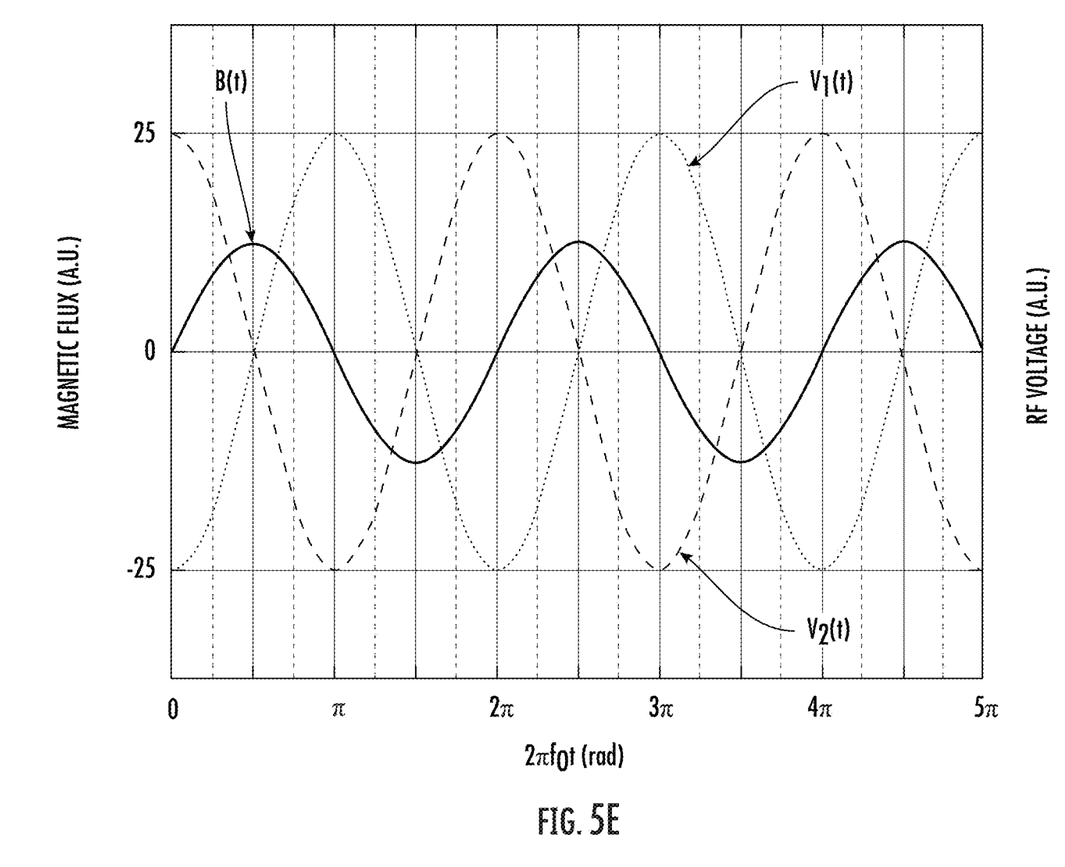
FIG. 5E presents simulation of electromagnetic properties of a resonator coil arranged according to embodiments of the disclosure.

FIG. 5E presents simulation of electromagnetic properties of a resonator coil arranged according to embodiments of the disclosure. In the figure B(t) represents the variable magnetic flux in the resonator coil, while $V_1(t)$ is the variable rf voltage on the first powered electrode, coupled to one end of the resonator coil, and $V_2(t)$ the variable rf voltage on the second powered electrode, coupled to the second end of the resonator coil. Temporal evolution of the magnetic flux and rf voltages on the electrodes is described by the rf phase equal to $2\pi f_0 t$ where t is the elapsed time. The magnetic flux may represent the flux running through the volume of the toroidal coil at a given instant. For half of the rf cycle the flux will be oriented in one direction, e.g., clockwise, and for the next half period the flux will be oriented counter clockwise.

As can be seen, there is a phase difference of $\pi/2$ radians (equivalent to 90 degrees) between the magnetic field and the voltages on the electrodes. According to Eqs. (2) and (3), the magnetic energy is zero when the electrostatic energy is maximum and vice versa. Also, there is a phase difference of π radians between the voltages on powered electrodes; thus, when the voltage on one electrode is +Vmax the voltage on the other electrode is −Vmax.

Figure 6A:
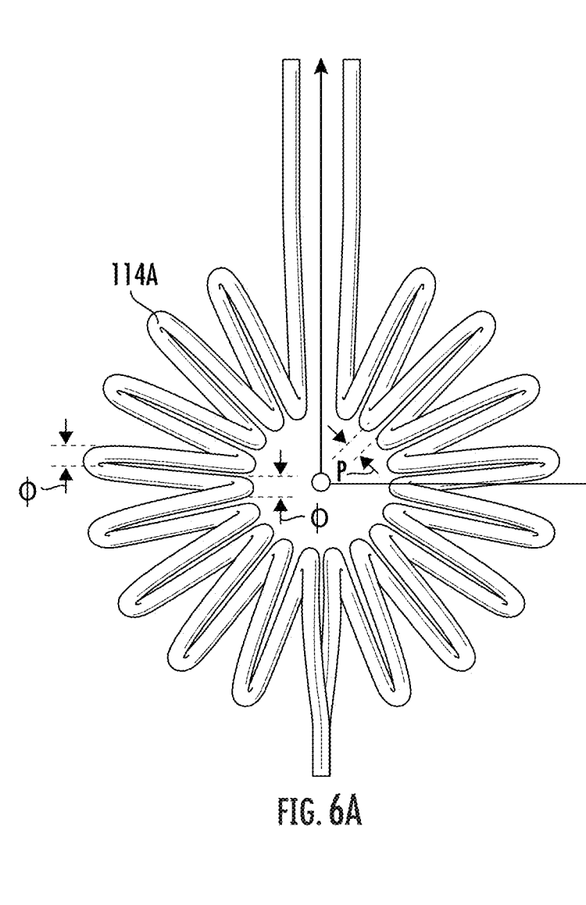
FIG. 6A and FIG. 6B show alternative embodiments of a toroidal coil for use as a resonator according to different embodiments of the disclosure.
Figure 6B:
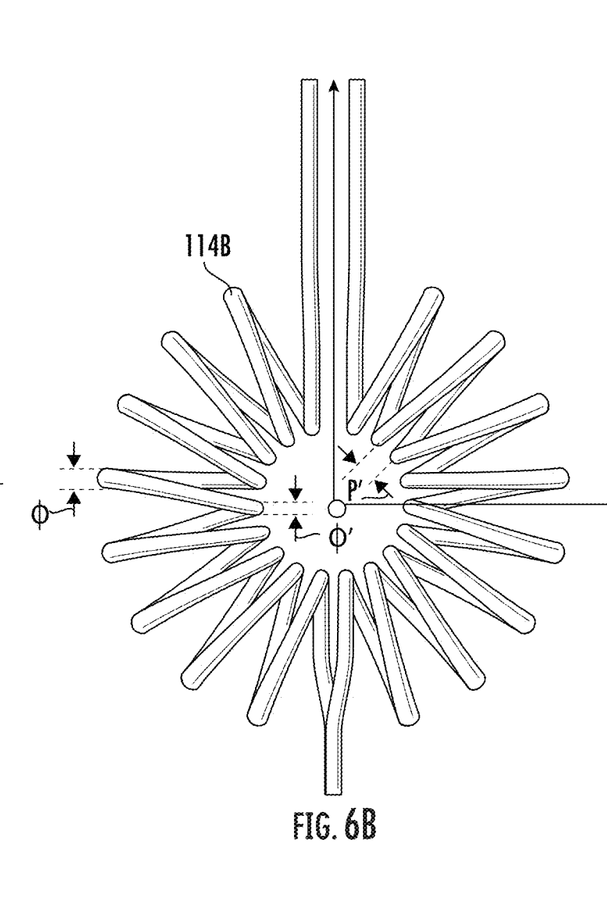
Figure 7:
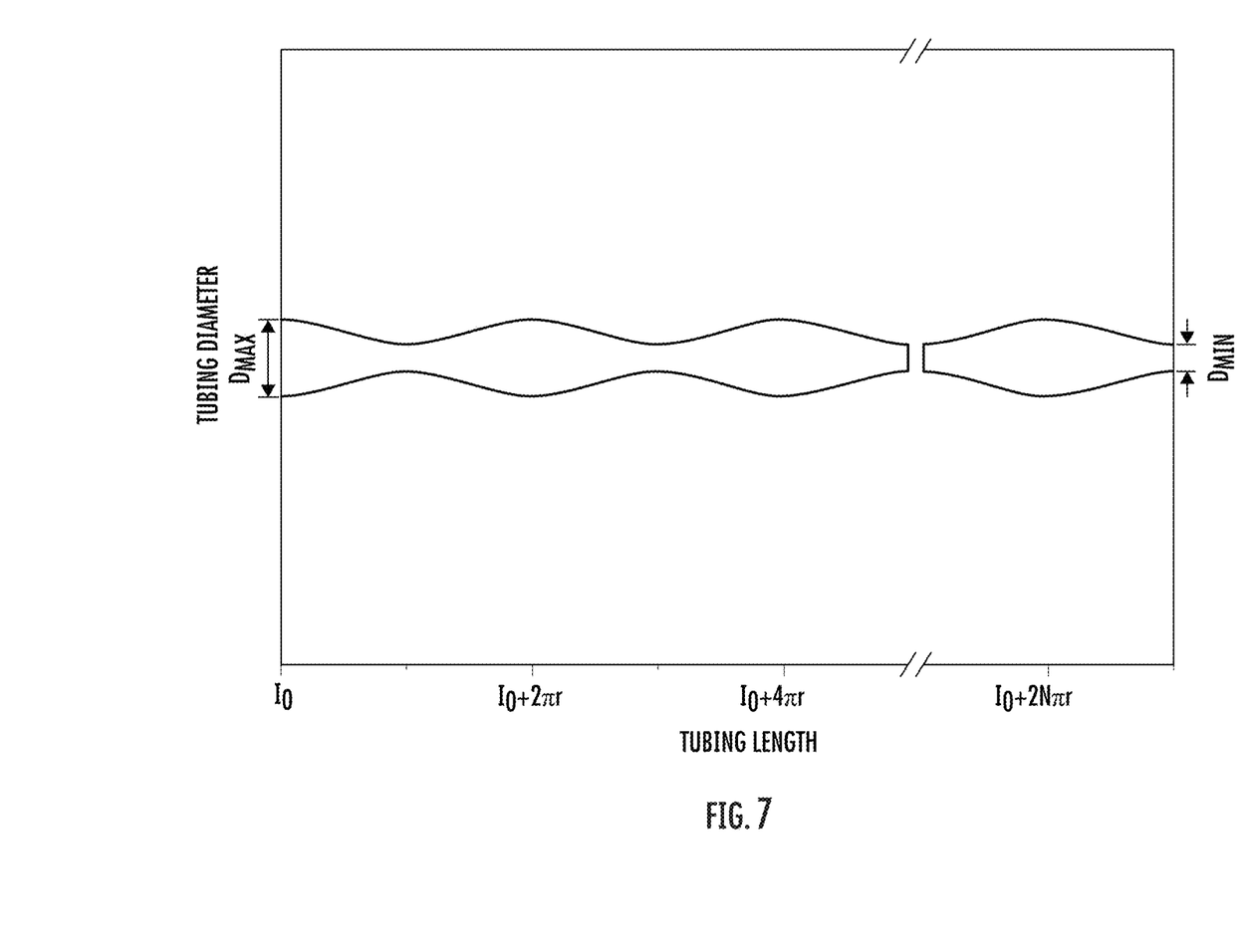
FIG. 7 shows the dependence of the coil tube diameter versus tube length for the coil embodiment depicted in FIG. 6B.

FIG. 6 A-FIG. 6B, and FIG. 7 show alternative embodiments of a toroidal coil for use as a resonator according to different embodiments of the disclosure. The toroidal coil 114A of FIG. 6A may be constructed from an electrically conductive tube, having a constant tube diameter (meaning non-varying tube diameter), where diameter is shown as ϕ, for simplicity of construction, where the pitch between adjacent turns in the inner portion of the toroidal coil 114A is defined as p. Because the RF current through the toroidal coil 114A may be restricted to a skin depth on the order of less than 20 micrometers for frequency in the 13.56 MHz range, the thickness of the walls of the conductive tube need not be thicker than 50 micrometers, 100 micrometers, or so. However, to provide mechanical sturdiness of the coil and to prevent mechanical vibrations, tube walls of few mm thickness are used.

The toroidal coil 114B of FIG. 6B may be constructed from an electrically conductive tube, having a continuously variable diameter, wherein an outer tube diameter ϕ, along an outer side of the toroidal coil 114B has a first dimension, and wherein an inner tube diameter ϕ', along an inner side of the toroidal coil 114B has a second dimension, less than the first dimension A result of this latter configuration is that the value of the p is relatively larger as compared to the embodiment of FIG. 6A, so that the electric field between adjacent turns of the toroidal coil 114B is relatively lesser. This lower electric field may help avoid arcing. In particular embodiments, as the tubing bends toward the inner part of the toroidal coil 114C, the diameter of the tube may continuously decrease so that at the inner side locations of the toroidal coil the tube has a minimal diameter, resulting in an increase of the pitch to a larger value p' In addition, a larger pitch means smaller interloop capacitance, and a resulting higher quality (Q) factor of the oscillating circuit.

$$Q = 2\pi f_0 \frac{\text{Energy stored}}{\text{Power dissipated}} \quad (4)$$

Note that in variants of the aforementioned embodiments, the shape of the individual turns of a toroidal coil may be characterized by an elliptical cross-section, such as a circular cross-section. As depicted in FIG. 7, a continuously variable diameter tubing, which tubing has a maximum diameter $d_{max}$ at the most outer locations of the coil and a minimum diameter $d_{min}$ at the most inner locations, with a periodicity of 2πr along the tube length, is used to build the coil shown in FIG. 6B.

Figure 8A:
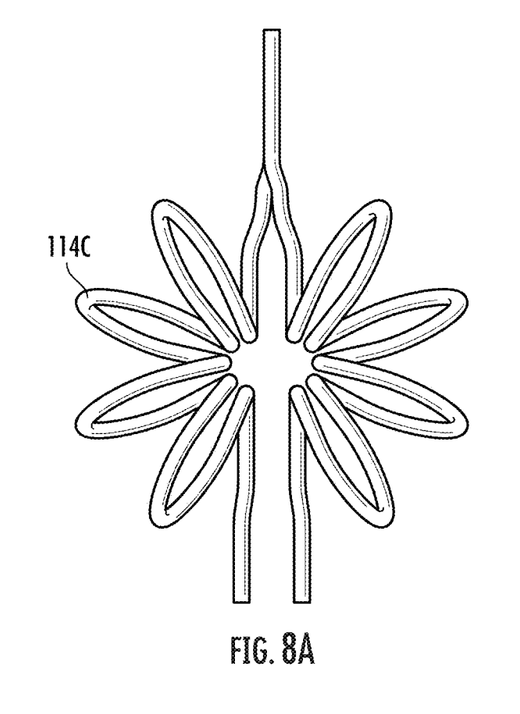
FIG. 8A-8C show a side view, perspective view, and front view, respectively, for a toroidal coil, according to embodiments of the disclosure.
Figure 8B:
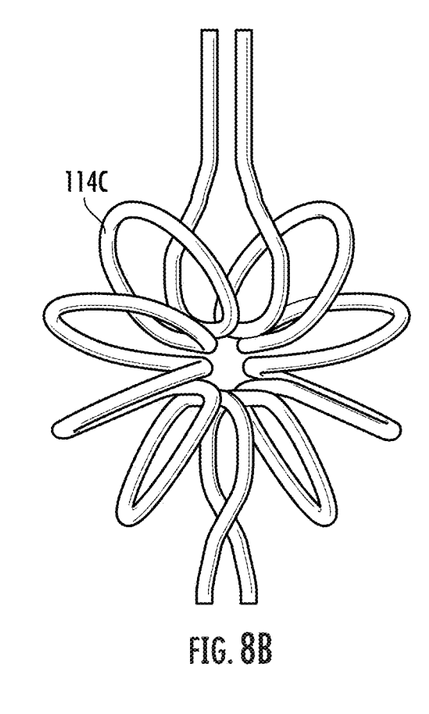
Figure 8C:
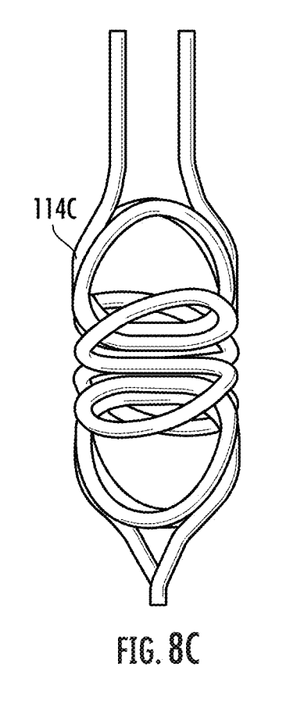

FIG. 8A, FIG. 8B, and FIG. 8C show a side view, perspective view, and front view, respectively, for a toroidal coil 114C, according to embodiments of the disclosure. In this example, the toroidal coil is characterized by coil turns defining a D-shaped cross-section. This D-shaped cross-section will increase the overall volume within a toroidal coil, as compared to a toroidal coil having coil turns defined by circular cross-section, given the same main diameter and same coil turn diameter.

Figure 9A:
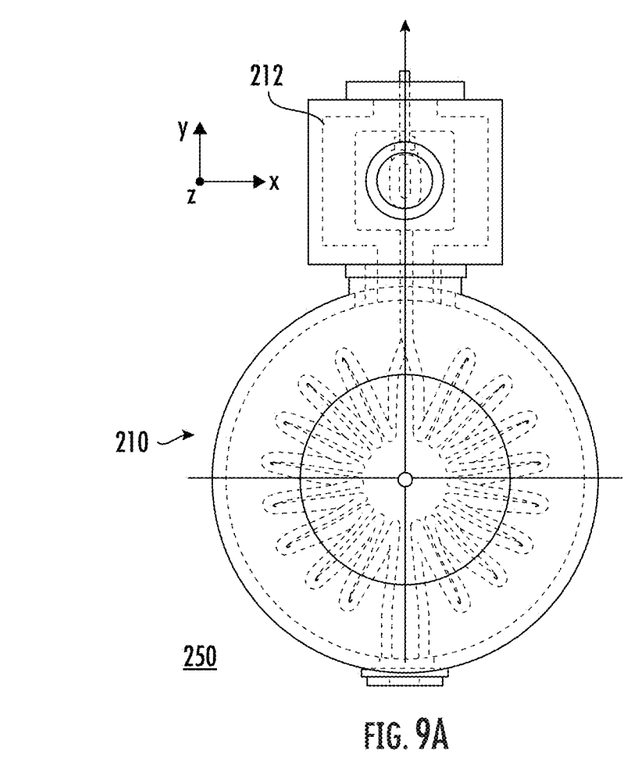
FIG. 9A and FIG. 9B show alternative configurations of a toroidal resonator according to different embodiments of the disclosure.
Figure 9B:
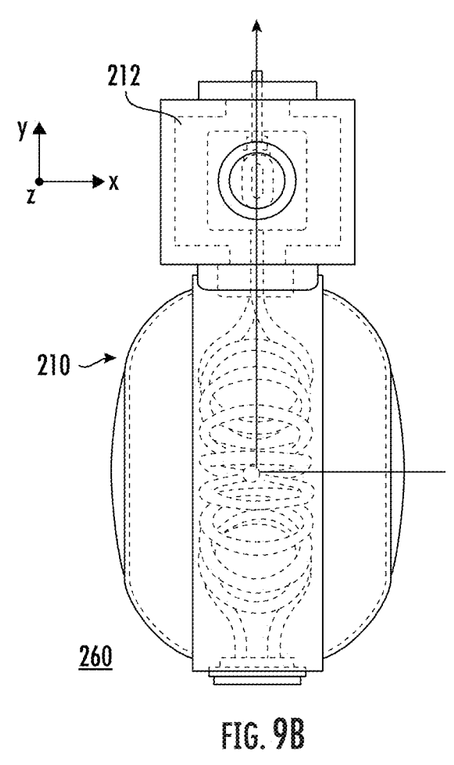

FIG. 9A and FIG. 9B show alternative configurations of a toroidal resonator according to different embodiments of the disclosure. Due to an azimuthal half symmetry, the toroidal geometry is very versatile to be arranged in different configurations: this versatility will allow minimization of the resonator foot print. The configuration 250 illustrates the housing 212 with the beam direction (along the Z-axis) moving in and out of the plane of the figure. The configuration 260 also illustrates the housing 212 with the beam direction (along the Z-axis) moving in and out of the plane of the figure. As shown, the axis of the toroidal coil of resonator 210 is aligned along the X-axis. When the resonators are aligned along the z axis, the configuration 250, depicted in FIG. 9A is desirable (the height of the can resonator is generally smaller than the diameter). Conversely, if the resonators are distributed in both z and azimuthal directions then configuration 260, depicted in FIG. 9B, is desirable.

FIG. 10 depicts a schematic of an apparatus, according to embodiments of the disclosure. The ion implanter 300 includes a linear accelerator 314. The ion implanter 300, may represent a beamline ion implanter, with some elements not shown for clarity of explanation. The ion implanter 300 may include an ion source 302, and a gas box 307 as known in the art. The ion source 302 may include an extraction system including extraction components and filters (not shown) to generate an ion beam 306 at a first energy. Examples of suitable ion energy for the first ion energy range from 5 keV to 300 keV, while the embodiments are not limited in this context. To form a high energy ion beam, the ion implanter 300 includes various additional components for accelerating the ion beam 306.

The ion implanter 300 may include an analyzer 310, functioning to analyze the ion beam 306 as in known apparatus, by changing the trajectory of the ion beam 306, as shown. The ion implanter 300 may also include a buncher 312, and a linear accelerator 314 (shown in the dashed line), disposed downstream of the buncher 312, where the linear accelerator 314 is arranged to accelerate the ion beam 306 to form a high energy ion beam 315, greater than the ion energy of the ion beam 306, before entering the linear accelerator 314. The buncher 312 may receive the ion beam 306 as a continuous ion beam and output the ion beam 306 as a bunched ion beam to the linear accelerator 314. The linear accelerator 314 may include a plurality of acceleration stages, represented by the resonators 110, arranged in series, as shown. In various embodiments, the ion energy of the high energy ion beam 315 may represent the final ion energy for the ion beam 306, or approximately the final ion energy. In various embodiments, the ion implanter 300 may include additional components, such as filter magnet 316, a scanner 318, collimator 320, where the general functions of the scanner 318 and collimator 320 are well known and will not be described herein in further detail. As such, a high energy ion beam, represented by the high energy ion beam 315, may be delivered to an end station 322 for processing a substrate 324. Non-limiting energy ranges for the high energy ion beam 315 include 500 keV-10 MeV, where the ion energy of the ion beam 306 is increased in steps through the various acceleration stages of the linear accelerator 314. In accordance with various embodiments of the disclosure, the acceleration stages of the linear accelerator 314 are powered by the resonators 110, where the design of resonators 110 may be in accordance with the embodiments of FIGS. 1-9B.

In view of the above, the present disclosure provides at least the following advantages. For one advantage, a smaller resonator footprint may be realized using a toroidal coil resonator of the present embodiments, and accordingly a smaller LINAC footprint as compared with known LINAC based ion implanters. The present embodiments further provide the advantage of a higher quality factor Q of the oscillating circuit as compared to solenoidal type resonators While certain embodiments of the disclosure have been described herein, the disclosure is not limited thereto, as the disclosure is as broad in scope as the art will allow and the specification may be read likewise. Therefore, the above description is not to be construed as limiting. Those skilled in the art will envision other modifications within the scope and spirit of the claims appended hereto.

The invention claimed is:

1. An apparatus, comprising:
    a drift tube assembly, arranged to transmit an ion beam, the drift tube assembly comprising:
        a first ground electrode;
        an RF drift tube assembly, disposed downstream of the first ground electrode; and
        a second ground electrode, disposed downstream of the RF drift tube assembly,
    wherein the RF drift tube assembly defines a triple gap configuration;
        a resonator, the resonator comprising a toroidal coil, the toroidal coil having a first end, connected to a first RF drift tube of the RF drift tube assembly, and a second end, connected to a second RF drift tube of the RF drift tube assembly; and
        a tuner, wherein the tuner comprises a tuner body, the tuner body being disposed in a first part along a first side of the toroidal coil, and being disposed in a second part along a second side of the toroidal coil.

2. The apparatus of claim 1, the toroidal coil having a first half and a second half, the first half comprising a first number of turns, equal to a second number of turns of the second half.

3. The apparatus of claim 1, the toroidal coil defining an elliptical cross-section.

4. The apparatus of claim 1, the toroidal coil defining a D-shaped cross-section.

5. The apparatus of claim 1, the toroidal coil comprising an electrically conductive tube, having a constant tube diameter.

6. The apparatus of claim 1, the toroidal coil comprising an electrically conductive tube, having a non-uniform tube diameter, wherein an outer tube diameter, disposed along an outer side of the toroidal coil has a first dimension, and wherein an inner tube diameter, disposed along an inner side of the toroidal coil has a second dimension, less than the first dimension.

7. The apparatus of claim 1, further comprising an exciter coil, disposed inside the toroidal coil, the exciter coil having a first leg connected to ground and a second leg coupled to an rf power assembly.

8. An ion implanter, comprising:
    an ion source to generate an ion beam; and
        a linear accelerator, to transport and accelerate the ion beam, the linear accelerator comprising a plurality of acceleration stages, wherein a given acceleration stage of the plurality of acceleration stages comprises:
            an RF power assembly, arranged to output an RF signal;
            a drift tube assembly, arranged to transmit the ion beam, and coupled to the RF power assembly, the drift tube assembly defining a triple gap configuration;
            a resonator, the resonator comprising a toroidal coil, the toroidal coil having a first end, connected to a first RF drift tube of the drift tube assembly, and a second end, connected to a second RF drift tube of the drift tube assembly; and
            a tuner, wherein the tuner comprises a tuner body, the tuner body being disposed in a first part along a first side of the toroidal coil, and being disposed in a second part along a second side of the toroidal coil.

9. The ion implanter of claim 8, the toroidal coil having a first half and a second half, the first half comprising a first number of turns, equal to a second number of turns of the second half.

10. The ion implanter of claim 8, the toroidal coil defining an elliptical cross-section.

11. The ion implanter of claim 8, the toroidal coil defining a D-shaped cross-section.

12. The ion implanter of claim 8, the toroidal coil comprising an electrically conductive tube, having a constant tube diameter.

13. The ion implanter of claim 8, the toroidal coil comprising an electrically conductive tube, having a non-uniform tube diameter, wherein an outer tube diameter, disposed along an outer side of the toroidal coil has a first dimension, and wherein an inner tube diameter, disposed along an inner side of the toroidal coil has a second dimension, less than the first dimension.

14. The ion implanter of claim 8, further comprising an exciter coil, disposed inside the toroidal coil, the exciter coil having a first leg connected to ground and a second leg coupled to an rf power assembly.

15. A resonator for a linear accelerator, comprising:
    an RF enclosure;
    a toroidal coil, disposed within the RF enclosure, the toroidal coil comprising:
        a first half, forming a first coil, having a first plurality of turns, wound in a first direction; and
        a second half, forming a second coil, having a second plurality of turns, wound in the first direction,
        wherein the first half further comprises a first end for coupling to a first electrode of the linear accelerator, and wherein the second half further comprises a second end for coupling to a second electrode of the linear accelerator; and
    an exciter coil, disposed inside the toroidal coil, the exciter coil having a first leg connected to ground and a second leg coupled to receive RF power.

16. The resonator of claim 15, the toroidal coil defining an elliptical cross-section.

17. The resonator of claim 15, the toroidal coil defining a D-shaped cross-section.

18. The resonator of claim 15, the toroidal coil comprising an electrically conductive tube, having a non-uniform tube diameter, wherein an outer tube diameter, disposed along an outer side of the toroidal coil has a first dimension, and wherein an inner tube diameter, disposed along an inner side of the toroidal coil has a second dimension, less than the first dimension.

* * * * *